Nov. 7, 1961
J. R. CAULK
3,008,043
COMMUNICATIONS RECEIVER
Filed June 22, 1959
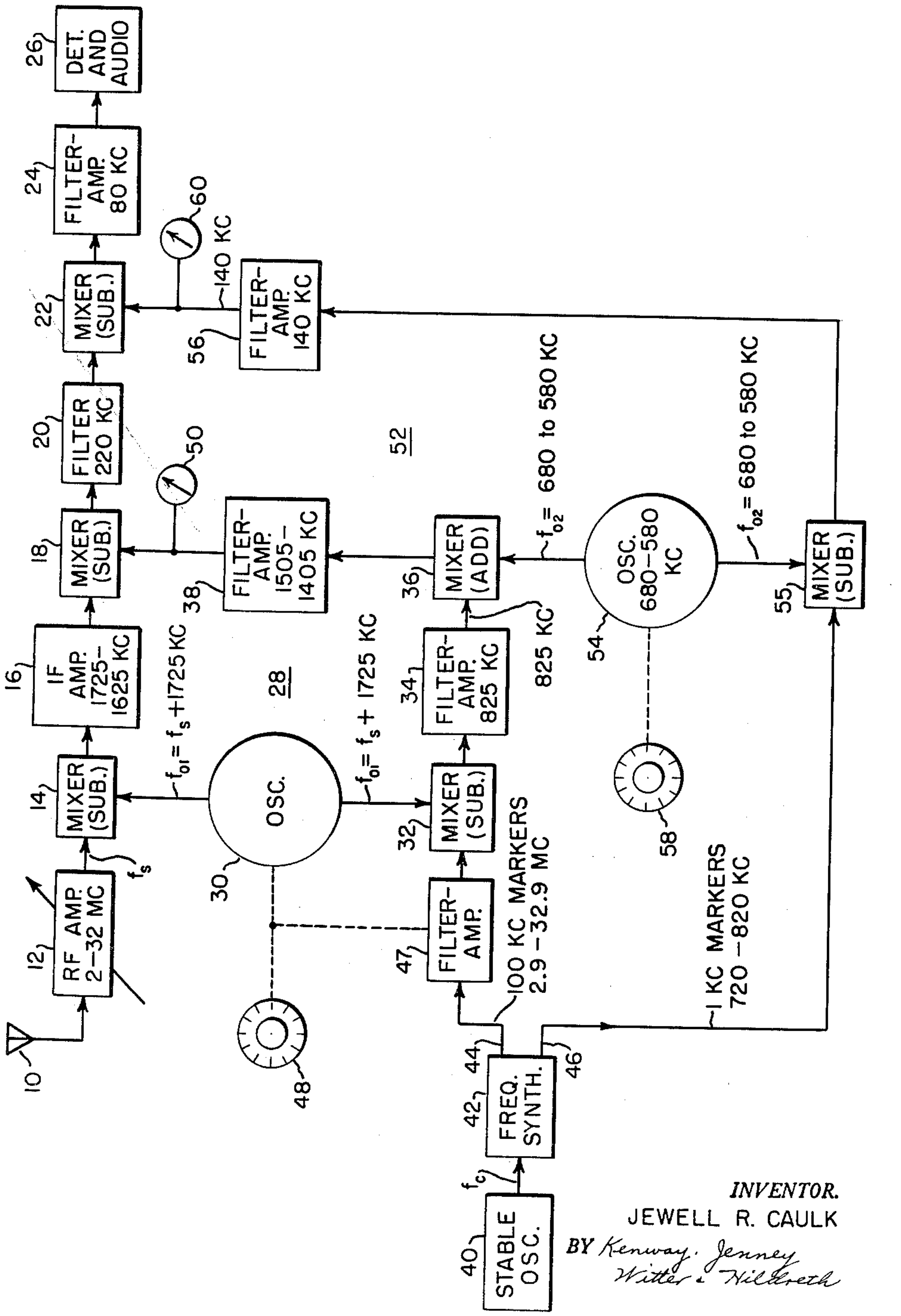
INVENTOR.
JEWELL R. CAULK
BY Kenway, Jenney, Witter & Hildreth
ATTORNEYS 3,008,043

COMMUNICATIONS RECEIVER

Jewell R. Caulk, North Reading, Mass., assignor to National Company, Inc., Malden, Mass., a corporation of Massachusetts Filed June 22, 1959, Ser. No. 821,811
14 Claims. (Cl. 250—20)

This invention relates to a highly selective communications receiver relatively free of drift and stable in the presence of severe shock and vibration. More particularly, it relates to a superheterodyne receiver utilizing a pair of tunable local oscillators in a multiple conversion circuit which cancels out oscillator frequency changes and thereby optimizes over-all frequency stability.

Stability is an important characteristic of communications receivers adapted for narrow band operation, where only a moderate amount of drift will place the incoming signal outside the pass band of the receiver. Furthermore, where a single sideband-suppressed carrier mode of signal transmission is utilized, severe distortion can result from even slight receiver drift. Narrow band receivers are generally of the superheterodyne type which convert the high frequency incoming signal to a lower intermediate frequency which is more readily subjected to narrow band filtering. In superheterodyne circuits, drift is largely caused by instability of the local oscillators used in the frequency conversion process. Where reception of only a single channel is required, the local oscillator may be crystal controlled to provide stability, and if more than one channel is desired, various crystals may be switched into the oscillator circuit to provide the desired conversion frequencies.

However, for continuous coverage of a wide band of frequencies, crystal control is not feasible, and tunable local oscillators must be used. Since tunable oscillators do not have the requisite stability, drift cancelling techniques have been used to eliminate oscillator instability as a cause of receiver drift. The output of each local oscillator is injected into a mixer in the signal path at two different places. At one point it is injected directly into the signal path, and at a second point it is injected after it is mixed with the output from a stable source such as a crystal oscillator. At the second injection point, the mixer output frequency is therefore influenced twice by the tunable local oscillator frequency, and if the proper choice of mixer output frequencies is made, drift in the oscillator will result in a tendency to increase the output frequency through one of the inputs at the second mixer and to decrease it by the same amount through the other of the inputs. The increase and decrease thereby cancel out, and the output of the latter mixer is free from drift resulting from drift in the local oscillator.

The application of the drift cancellation techniques described to a receiver require that the receiver be tuned incrementally rather than continuously. Since small changes in the frequency of the tunable local oscillator do not result in changes in the signal frequencies detected by the receiver, tuning cannot be accomplished in the usual manner. Therefore, the stable oscillator is combined with a frequency synthesizer whose output contains a number of equally spaced frequencies. These frequencies are successively selected to beat with the output of a tunable oscillator in order to shift the frequency response of the receiver. Where the signal frequency is of the order of several megacycles per second, it is most practical to provide tuning increments on the order of 100 kilocycles. The resulting bandwidth, i.e., 100 kilocycles, is much greater than the individual channel bandwidth, and therefore a second intermediate frequency drift cancelled section similar to the first is provided to subdivide the broad band at the output of the first section into smaller increments, e.g., 1 kilocycle. It should be noted that the use of drift cancellation techniques in this manner is consistent with multiple frequency conversion, which is desirable to arrive at a final intermediate frequency low enough to permit the use of sharp, stable filters for narrow band reception, while utilizing a high enough initial intermediate frequency to minimize image interference.

Prior to the present invention, multiple drift cancellation was accomplished by merely cascading two drift cancellation circuits in the signal path of the receiver, the first circuit providing broad- and the second fine-tuning as described above. Thus, in the signal path four mixers were provided, two for each of the drift cancellation circuits. Between the signal-frequency input to the receiver and the final intermediate frequency, there were there additional intermediate frequencies. Assuming a signal-frequency tuning range of 2–32 megacycles, the use of a total of four intermediate frequencies requires that the various frequencies in the signal path of the receiver be close together. This has resulted in image interference problems. Furthermore, the use of successive drift cancellation circuits has, prior to my invention, required a narrow band filter in the signal path tunable in conjunction with the local oscillator of the second drift cancellation circuit. This presents a problem of tracking if the filter is to be mechanically coupled to the local oscillator to permit single-knob tuning of the circuit. Furthermore, it is difficult to obtain a narrow bandwidth over the entire range of the tunable circuit, inasmuch as the Q varies with the L/C ratio, which is changed as the circuit is tuned.

Accordingly, it is a principal object of my invention to provide an improved communications receiver capable of narrow bandwith, high stability operation and yet tunable over a substantial signal frequency range, for example, 2–30 megacycles. It is another object of the invention to provide a receiver of the above character capable of both long term and short term stability, i.e., it should be free from long term drift commonly associated with aging, temperature changes, etc., and also immune from such short term effects as shock and vibration. A further object of the invention is to provide a receiver of the above character relatively free from image interference. Yet another object of the invention is to provide a receiver having the characteristics described in which the narrow band intermediate frequency circuits are fixed tuned, thereby eliminating tracking problems and permitting cascading of a greater number of tuned circuits for better selectivity. Other objects of my invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawing which is a schematic diagram, in block form, of a receiver incorporating the principles of my invention.

The radio receiver of my invention makes use of a pair of drift cancellation circuits which provide the advantages enumerated above. However, instead of cascading two separate circuits, I have combined them so that the first injection point of the second circuit coincides with the second injection point of the first circuit. This eliminates one of the four mixers in the signal path previously required with two drift cancellation circuits. The number of intermediate frequencies between the signal frequency input to the receiver and the final intermediate frequency is thereby reduced to two, and this eliminates the image interference problem encountered when more intermediate frequencies, with the attendant closer spacing between them, are used. The invention also eliminates the requirement for a tunable intermediate frequency filter in the second drift cancellation circuit. This filter may therefore be of the fixed-tuned type, and with the tracking problem involved in tuning the filter along with a local oscillator thereby eliminated, a greater number of tuned circuits may be provided to obtain a narrow bandwidth with sharp skirt selectivity.

The principles of my invention will best be understood from the drawing in which the input to the receiver is, by way of an antenna schematically indicated at 10, connected to a tunable radio-frequency amplifier 12. The output of the amplifier 12 is heterodyned in a first signal mixer 14; the output signal of the mixer 14 is passed through an intermediate frequency filter-amplifier 16 to a second signal mixer 18. The signal from the mixer 18 is filtered by an intermediate frequency filter 20 and then applied to a third signal mixer 22. The signal path through the receiver is completed by a filter-amplifier 24 and detector and audio circuits schematically indicated at 26. The latter may take any conventional form suitable for the modulation on the received signal.

The first signal frequency conversion is accomplished by a drift-cancelled local oscillator loop generally indicated at 28. The loop 28 includes a tunable local oscillator 30 whose output is connected to the mixer 14 and to a second mixer 32. The output of the mixer 32 is connected to a filter-amplifier 34 whose signal is in turn connected as one input of a mixer 36. The output signal from the mixer 36 is passed through a filter-amplifier 38 to the second signal mixer 18.

A crystal-controlled local frequency source includes a stable oscillator 40 and a frequency synthesizer 42. The frequency of the oscillator 40 may be kept within close limits by temperature control of the crystal and other well-known techniques. The synthesizer 42 has an output terminal 44 which provides a signal having uniformly spaced frequency components or markers covering a range corresponding to the tuning range of the radio-frequency amplifier 12. A second output terminal 46 of the synthesizer provides a signal having uniformly spaced marker frequencies extending over a range corresponding to the spacing between the frequencies appearing at the terminal 44. The synthesizer 42 may, by way of example, contain frequency dividers which divide the output frequency of the oscillator 40 to arrive at frequencies corresponding to the intervals between the output frequencies at the terminals 44 and 46. The outputs of the dividers may then be applied to harmonic generators whose outputs include the frequencies at the synthesizer output terminals, and suitable filters in the synthesizer restrict the outputs thereof to the harmonics falling within the desired regions. A tunable filter-amplifier 47 is interposed between the terminal 44 and the mixer 32.

The operation of the loop 28 may be illustrated by using representative values of frequencies in the receiver. It should be understood, however, that other frequency values may be used, and the manner in which they may be selected will be understood from the following description. Assume, for example, that the radio-frequency amplifier 12 is tunable over the 2–32 megacycle range, as indicated on the dial 48 associated with the local oscillator 30. The oscillator then may cover a range of 3.725 to 33.725 megacycles or 1725 kilocycles higher than the reading on the dial. I prefer to mark the dial in 100 kilocycle divisions. The frequencies at the output terminal 44 of the synthesizer 42 are 100 kilocycles apart, in that case, and cover the range of 2.9 to 32.9 megacycles. The filter-amplifier 47, which is also tuned by the turning of the dial 48, is set to pass the frequency at the output terminal 44 of the synthesizer 42 which is 900 kilocycles above the reading of the dial 48. This frequency is 825 kilocycles below that of the oscillator 30, and the filter-amplifier 34 passes this difference frequency.

The tuning of the filter-amplifier 47 is not critical, since several of the 100 kilocycle marker frequencies in addition to the correct one may be passed to the mixer 32 without undesirable effects. To avoid image problems, however, the filter-amplifier 47 should reject frequencies above the frequency of the oscillator 30 and also should not pass any two frequencies 800 kilocycles apart. Two frequencies 800 kilocycles apart would produce an 800 kilocycle output from the mixer 32 within the pass band of the filter-amplifier 34. The bandwidth of the amplifier 34 should be sufficient to allow for drift of the oscillator 30, which is cancelled in a manner described below. However, it should be limited to obtain further rejection of image frequencies from the synthesizer 44. The closest of these image frequencies to the 825 kilocycle center frequency of the amplifier are at 775 kilocycles and 875 kilocycles. Therefore, I prefer to limit the bandwidth of the amplifier to approximately 50 kilocycles.

Accordingly, as the local oscillator 30 is tuned, a signal appears at the output of the amplifier 34 each time the oscillator frequency is 825 kilocycles above one of the marker frequencies from the synthesizer 44. This occurs every 100 kilocycles over the oscillator tuning range, and this is the reason for making the dial 48 in 100 kilocycle increments. Between the 100 kilocycle increments, as the output frequency of the mixer 32 passes out of the pass band of the amplifier 34, the output of the latter ceases. When oscillator 30 is set to a frequency which does not produce an output from amplifier 34, there is no output from the mixer 36 within the pass band of the filter-amplifier 38 and, consequently, no signal output from the mixer 18. In other words, roughly speaking, the signal output at the mixer 18 occurs only at 100 kilocycle intervals on the dial 48. Therefore, the amplifier 16 should have a pass band of approximately 100 kilocycles to accommodate signal frequencies in the intervals between the tuning increments of the oscillator 30. This pass band runs from 1625 to 1725 kilocycles.

Thus, with the 100 kilocycle pass band of the amplifier 16 and an output occurring at the second signal mixer 18 every 100 kilocycles in the tuning range of the oscillator 30, successive 100 kilocycle bands are passed through the amplifier 16 as the frequency of the oscillator 30 is moved through each 100 kilocycle increment. To put it another way, each time the frequency of oscillator 30 shifts by the tuning increment of 100 kilocycles, the group of signal frequencies beating with the oscillator output to form resultant intermediate frequencies within the pass band of the amplifier 16 is shifted by the same amount. A meter 50 connected to the output of the amplifier 38 serves as a tuning indicator for the oscillator 30.

To accomplish fine tuning of the receiver, I have provided a second drift cancelled local oscillator loop 52 which divides the 100 kilocycle bands at the output of the amplifier 16 into 100 one-kilocycle increments. This interpolation function is accomplished by a tunable local oscillator 54 whose output is connected to the mixer 36 and also to a mixer 55, the output of the latter being passed through a filter-amplifier 56 and thence to the third signal mixer 22. The other input to the mixer 55 consists of the 1 kilocycle marker frequencies appearing at the output 46 of the synthesizer 42. The oscillator 54 is tuned by a dial 58 which may be scaled off into 100 intervals marking the individual kilocycle increments tuned by the loop 52.

Illustratively, the oscillator 54 may be tuned from 680 kilocycles down to 580 kilocycles corresponding to readings of 0 to 100 on the dial 58. The amplifier 38 should then have a pass band from 1505 down to 1405 kilocycles, the range of the sum of the frequencies appearing at the inputs of the mixer 36. The filter 20 is set for relatively sharp response at the difference in frequency between the inputs to the mixer 18, viz., 220 kilocycles. Thus, with the dial 58 set at 0 to produce a frequency of 680 kc. from the oscillator 54 and 1505 kc. from the amplifier 38, the signal appearing at the output of the filter 20 will be the receiver input signal producing a beat frequency of 1725 kilocycles in the amplifier 16 when mixed with the output of oscillator 30. The radio-frequency signal is then exactly at the frequency indicated by the dial 48.

If the radio frequency to be tuned is at some 100 kilocycle point plus 31 kilocycles, e.g., 10.431 megacycles, the dial 48 will be set at the correct 100 kc. point, i.e., 10.4, and the kilocycle dial 58 at the correct kilocycle point, i.e., 31. The output of the amplifier 16 will include signals corresponding to the radio-frequency range of 10.4 to 10.5 megacycles. The frequency of the oscillator 54 will be 649 kilocycles, and after mixing with the 825 kilocycle signal from the amplifier 34, a frequency of 1474 kilocycles will appear at the output of the amplifier 38. This must beat with a signal at 1694 kilocycles from the amplifier 16 to produce an output from the mixer 18 at the 220 kilocycle frequency of the filter 20. The 1694 kc. frequency in the amplifier 16 results from a 10.431 megacycle input to the amplifier 12, and the receiver is therefore correctly tuned.

The filter-amplifier 56 is tuned to a frequency of 140 kilocycles, and the filter-amplifier 24 responds to 80 kilocycle signals appearing at the output of the mixer 22, that is, the difference between the 140 kilocycle signals from the amplifier 56 and the 220 kilocycle output of the filter 20. The frequency synthesizer 42 provides frequencies at 1 kilocycle intervals over a range of 720 to 820 kilocycles at the output terminal 46. Accordingly, as the oscillator 54 is tuned over its range, its output beats with successive 1 kilocycle marker frequencies to provide the difference frequency of 140 kilocycles from the mixer 55 passed by the amplifier 56. The pass band of the amplifier 56 is considerably less than 1 kilocycle. Therefore, there will be an output from the amplifier 56 and the filter-amplifier 24 only when the oscillator 54 is tuned roughly to one of the divisions on the dial 58. Each time the dial is shifted one increment, a different 1 kilocycle marker provides a beat note in the mixer 54 at the frequency of the amplifier 56. A meter 60 indicating the output voltage of the amplifier 56 may therefore be employed to indicate proper adjustment of the dial 58.

The manner in which the loops 28 and 52 provide exact, stable tuning of an incoming signal is as follows. Assume that a signal frequency between 10.4 and 10.5 megacycles is to be received. The dial 47 is set to 10.4. If the frequency of the oscillator 30 is not exactly 12.125 mc. (10.4 mc. plus 1.725 mc.) but rather somewhat higher, say 12.135, the desired signal will appear at 1704 kilocycles in the amplifier 16 instead of the nominal 1694 kilocycles. However, the beat note produced by the mixer 32 and passed by the amplifier 34 will be 835 kilocycles instead of 825, and the output of the mixer 36 passed by the amplifier 38 will be at 1484 instead of 1474 kilocycles. When subtracted from the intermediate frequency signal by the mixer 18, this produces an intermediate frequency at 220 kilocycles as would be the case if the oscillator 30 were exactly on frequency. Accordingly, the loop 28 provides an output from the mixer 18 exactly correct with respect to the 100 kilocycle tuning increments supplied by the synthesizer 42 at its output terminal 44. Thus, as previously explained, the drift of local oscillator 30 is cancelled by the loop 28.

In like manner, the loop 52, by means of drift cancelation, maintains the receiver at the correct 1 kilocycle point within the 100 kilocycle output band of the loop 28. For example, should the oscillator 54 drift from its proper frequency to a lower frequency, the output of the amplifier 38 will decrease in frequency by the same amount, as will the output of the mixer 18 and the signal input of the mixer 22. At the same time, the output of the mixer 55 will decrease in frequency as will the other input to the mixer 22. Since the filter-amplifier 24 passes the difference in the frequencies fed to the mixer 22, the equal changes in frequency at the two inputs of the latter will cancel, thereby leaving the desired signal exactly in tune. The loop 52 thus works in conjunction with the loop 28 to keep the receiver exactly in tune to an incoming signal in spite of drift of the two tunable local oscillators 30 and 54. Of equal importance, the receiver may be accurately pretuned to a desired frequency with extreme accuracy, with the aid of the meters 50 and 60, and maintained at that frequency by the drift cancellation of loops 28 and 52. Thus, there need be no lost time due to tuning of the receiver after transmission has begun on the desired frequency.

Among the important advantages of my invention is the requirement of only the three mixers 14, 18 and 22 in the signal path. This is one less than the number previously required in receivers operating with two drift cancelled loops. The number of intermediate frequencies required is also reduced, since there must be an additional intermediate frequency for every mixer in the signal path. This substantially mitigates the problem of image interference, since, with fewer intermediate frequencies, they can be more widely spaced. Further, a sharply tuned tunable filter formerly required in the signal path in the second drift cancelled loop has been eliminated. In the circuit described above, the second loop requires only the fixed tuned filter 20, which may have as many stages of filtering as desired. Other frequency combinations than those given above may be employed, and it will also be apparent that addition and subtraction of frequencies may be combined in other sequencies than those described in order to obtain drift cancellation.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

I claim:

1. A radio communications receiver comprising, in combination, a first tunable local oscillator, a first mixer deriving its input from said first oscillator and the input signal to said receiver to produce first intermediate frequencies, a second mixer deriving its input from said first oscillator and a stable source of uniformly spaced first marker frequencies, a second tunable local oscillator, a third mixer deriving its input from said second oscillator and said second mixer, a first filter connected to the output of said third mixer, a fourth mixer deriving its input from said first filter and said first mixer and thereby producing a second intermediate frequency, a stable source of uniformly spaced second marker frequencies, the interval between said second marker frequencies being substantially less than the interval between said first marker frequencies, a fifth mixer deriving its input from said second oscillator and said second stable source, a second filter connected to the output of said fifth mixer, and a sixth mixer deriving its input from said fourth mixer and said second filter thereby to provide a third intermediate frequency, the frequencies of said oscillators and the pass bands of said first and second filters being so related as to provide for cancellation of the drift of said tunable oscillators at the outputs of said fourth and sixth mixers.

2. The combination defined in claim 1 in which the bandwidth of said second filter is less than the interval between said second marker frequencies.

3. The combination defined in claim 1 in which the bandwidth of said first filter is substantially equal to the interval between said first marker frequencies.

4. The combination defined in claim 1 including a third filter connected between said second and third mixers and adapted to pass a single one of the frequencies appearing at the output of said second mixer.

5. The combination defined in claim 1 including a meter for measuring the output voltage of said first filter.

6. The combination defined in claim 1 including a meter for measuring the output of said second filter.

7. The combination defined in claim 1 including a third filter connected between said first and fourth mixers, said third filter tuned to said first intermediate frequencies and having a bandwidth substantially equal to the interval between said first marker frequencies.

8. A communications signal receiver comprising, in combination, a first tunable local oscillator to provide signals of variable frequency, a first mixer combining the first local oscillator signal with the received signals to provide a first intermediate frequency signal, means to produce a first and a second series of fixed frequency signals, means combining the first local oscillator signal with the first series of fixed frequency signals to provide a first drift cancellation signal, a second tunable local oscillator to provide signals of variable frequency, means combining the second local oscillator signal with the first drift cancellation signal to provide a modified drift cancellaion signal which is frequency responsive to said first and second local oscillator signals, a second mixer combining said modified drift cancellation signal with said first intermediate frequency signal to provide a second intermediate frequency signal, means combining said second local oscillator signal with the second series of fixed frequency signals to provide a second drift cancellation signal, a third mixer combining said second intermediate frequency signal with said second drift cancellation signal to provide a third intermediate frequency signal, means to amplify said third intermediate frequency signal, and means to detect said third intermediate frequency signal.

9. The combination defined in claim 8 including a broad band intermediate frequency amplifier in the signal path between said first and second mixers.

10. The combination defined in claim 9 including a sharply tuned filter connected in the signal path between said second and third mixers.

11. A communications receiver comprising, in combination, a selective radio-frequency amplifier, a first tunable local oscillator, a first mixer deriving its input from said radio-frequency amplifier and said first oscillator, a source of uniformly spaced first marker frequencies, a second mixer deriving its input from said first oscillator and said source of first frequencies, a first filter connected to the output of said first mixer and passing a first intermediate frequency corresponding to the difference between the frequencies fed to said first mixer, the bandwidth of said first filter approximating the interval between said first marker frequencies, a second filter connected to the output of said second mixer and passing a frequency which is the difference of the frequency of said first oscillator and one of said marker frequencies, the bandwidth of said second filter being substantially less than the interval between said first marker frequencies, a second local oscillator tunable over a range equal to said interval between said first marker frequencies, a third mixer deriving its input from said second filter and said second oscillator, a third filter adapted to pass the sum of the frequencies at the input to said third mixer, a fourth mixer deriving its input from said first and third filters, a fourth filter adapted to pass a second intermediate frequency corresponding to the difference between the frequencies appearing at the input to said fourth mixer, a second source of uniformly spaced second marker frequencies whose interval is substantially less than said interval between said first frequencies, a fifth mixer deriving its input from said second oscillator in said second source, a fifth filter adapted to pass a single frequency appearing at the output of said fifth mixer, a sixth mixer deriving its input from said fourth and fifth filters, the frequency characteristics of said filters and the frequencies of said oscillators being so related as to provide an output from said sixth mixer which is substantially independent of drift of said first and second oscillators.

12. The combination defined in claim 11 including a sixth filter connected to the output of said sixth mixer and adapted to pass a third intermediate frequency, and output circuits connected to the output of said sixth filter.

13. The combination defined in claim 11 including a first meter adapted to register the voltage at the output of said third filter.

14. The combination defined in claim 11 including a second meter connected to indicate the voltage appearing at the output of said fifth filter.

References Cited in the file of this patent

UNITED STATES PATENTS

| | | |
|---|---|---|
| 2,509,963 | Collins | May 30, 1950 |
| 2,843,740 | Mantz | July 15, 1958 |
| 2,874,278 | Berge et al. | Feb. 17, 1959 |